United States Patent
Chang et al.

(10) Patent No.: US 9,559,705 B1
(45) Date of Patent: Jan. 31, 2017

(54) CLOCK AND DATA RECOVERY CIRCUIT WITH BIDIRECTIONAL FREQUENCY DETECTION AND ELECTRONIC DEVICE USING THE SAME

(71) Applicants: NCKU RESEARCH AND DEVELOPMENT FOUNDATION, Tainan (TW); HIMAX TECHNOLOGIES LIMITED, Tainan (TW)

(72) Inventors: Soon-Jyh Chang, Tainan (TW); Yen-Long Lee, Tainan (TW); Chung-Ming Huang, Tainan (TW); Yen-Chi Chen, Tainan (TW)

(73) Assignees: NCKU RESEARCH AND DEVELOPMENT FOUNDATION, Tainan (TW); HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 14/953,041

(22) Filed: Nov. 27, 2015

(51) Int. Cl.
*H03L 7/08* (2006.01)
*H03L 7/18* (2006.01)
(Continued)

(52) U.S. Cl.
CPC ............. *H03L 7/0807* (2013.01); *H03L 7/087* (2013.01); *H03L 7/0995* (2013.01); *H03L 7/18* (2013.01); *H04L 7/0087* (2013.01); *H04L 43/16* (2013.01)

(58) Field of Classification Search
CPC ........ H03L 7/0807; H03L 7/0995; H03L 7/18; H03L 7/183; H03L 7/22; H03L 7/23; H04L 7/0087; H04L 43/16
See application file for complete search history.

(56) References Cited

U.S. PATENT DOCUMENTS 7,095,259 B2 * 8/2006 Knotts .................... H03L 7/087
327/156
7,256,655 B2 * 8/2007 He ........................ G11B 7/0053
331/11
(Continued)

FOREIGN PATENT DOCUMENTS

KR 20120004697 A * 1/2012

OTHER PUBLICATIONS

Liu et al., "A 155.52 Mbps-3.125 Gbps Continuous-Rate Clock and Data Recovery Circuit", Jun. 2006, IEEE Journal of Solid-State Circuits vol. 41., No. 4, pp. 1380-1390.*
(Continued)

*Primary Examiner* — Sophia Vlahos
(74) *Attorney, Agent, or Firm* — McClure, Qualey & Rodack, LLP

(57) ABSTRACT

A clock and data recovery (CDR) circuit is provided. A phase detection circuit receives an input signal and a clock signal to output a first voltage signal. A first comparing circuit determines whether the first voltage signal is within a voltage range to output a first up signal and a first down signal. A counting circuit updates a counting value according to the input signal and the clock signal. A second comparing circuit determines whether the counting value is within a value range to output a second up signal and a second down signal. A selection circuit outputs a second voltage signal according to the first up signal, the first down signal, the second up signal, and the second down signal. A voltage controlled oscillator outputs the clock signal according to the first voltage signal and the second voltage signal.

13 Claims, 12 Drawing Sheets

(51) Int. Cl.
  *H03L 7/087*    (2006.01)
  *H03L 7/099*    (2006.01)
  *H04L 7/00*     (2006.01)
  *H04L 12/26*    (2006.01)

(56) References Cited

U.S. PATENT DOCUMENTS 8,456,205 B2 *  6/2013  Usugi ................. H03D 13/004
                                                    327/145
8,457,269 B2 *  6/2013  Chang .................... H04L 7/033
                                                    327/148

OTHER PUBLICATIONS

Rajesh Inti et al., "A 0.5-to-2.5 Gb/s Reference-Less Half-Rate Digital CDR With Unlimited Frequency Acquisition Range and Improved Input Duty-Cycle Error Tolerance," IEEE Journal of Solid-State Circuits, vol. 46, No. 12, Dec. 2011.

Rong-Jyi Yang et al., "A 3.125-Gb/s Clock and Data Recovery Circuit for the 10-Gbase-LX4 Ethernet," IEEE Journal of Solid-State Circuits, vol. 39, No. 8, Aug. 2004.

\* cited by examiner

CLOCK AND DATA RECOVERY CIRCUIT WITH BIDIRECTIONAL FREQUENCY DETECTION AND ELECTRONIC DEVICE USING THE SAME

BACKGROUND

Field of Invention

The present invention relates to a clock and data recovery circuit with bidirectional frequency detection, in which two types of frequency detection are combined.

Description of Related Art

Clock and data recovery (CDR) is a critical task in all serial communication systems. The main objective of the CDR is to recover the data from the serial input bit stream in an error-free, power and cost-efficient manner. Due to the communication technology progresses, lots of transmission standards are developed such as the universal serial bus (USB), thunderbolt, high-definition multimedia interface (HDMI), serial advanced technology attachment (SATA) and so on. In some display application, the transmission speed varies by resolution, refresh rate, or operating mode. In order to recover the transmitted data for numerous communication standards and transmission speed without external reference clock in the receiver end, a wide range frequency detector and a wide band voltage-controlled oscillator (VCO) are indispensable in such development. However, in some wide-range frequency detectors, it may not precisely trace the frequency of the serial input bit stream; and on the other hand, a precise frequency detector may not have wide frequency range. Therefore, it is an issue in the art that how to provide a precise and wide-range CDR circuit.

SUMMARY

Embodiments of the invention provide a clock and data recovery (CDR) circuit. The CDR circuit includes following units. A phase detection circuit receives an input signal and a clock signal, and detects a phase difference between the input signal and the clock signal to output a first voltage signal. A first comparing circuit is coupled to the phase detection circuit for determining whether the first voltage signal is within a voltage range to output a first up signal and a first down signal. A counting circuit receives the input signal and the clock signal, takes one of the input signal and the clock signal as a reset signal, takes the other one of the input signal and the clock signal as a trigger signal, and update a counting value according to the reset signal and the trigger signal. A second comparing circuit is coupled to the counting circuit for determining whether the counting value is within a value range to output a second up signal and a second down signal. A selection circuit is coupled to the first comparing circuit and the second comparing circuit for outputting a second voltage signal according to the first up signal, the first down signal, the second up signal and the second down signal. A voltage controlled oscillator is coupled to the phase detection circuit and the selection circuit for outputting the clock signal according to the first voltage signal and the second voltage signal.

In some embodiments, the counting circuit comprises following unit. A first divider receives the input signal and divides the input signal by a first number to generate the reset signal. A second divider receives the clock signal and divides the clock signal by a second number to generate the trigger signal. The second number is less than the first number. A counter is coupled to the first divider and the second divider for updating the counting value according to the trigger signal and the reset signal. A register is coupled to the counter for storing the counting value.

In some embodiments, the second comparing circuit is configured to determine whether the counting value is greater than a first predetermined value, and determine whether the counting value is less than a second predetermined value. The first predetermined value is greater than the second predetermined value. If the counting value is greater than the first predetermined value, the second comparing circuit enables the second down signal and disables the second up signal. If the counting value is less the first predetermined value and greater than the second predetermined value, the second comparing circuit disables the second down signal and the second up signal. If the counting value is less than the second predetermined value, the second comparing circuit enables the second up signal and disables the second down signal.

In some embodiments, the counting value has 5 bits, and the second comparing circuit includes following unit. A first AND gate receives a fourth bit and a fifth bit of the counting value. A first OR gate receives a first bit, a second bit and a third bit of the counting value. A second AND gate is coupled to an output terminal of the first AND gate and an output terminal of the first OR gate for outputting the second down signal. A third AND gate receives the third bit and the fourth bit of the counting value. A second OR gate receives the first bit and the second bit of the counting value. A fourth AND gate is coupled to an output terminal of the third AND gate and an output terminal of the second OR gate. A third OR gate has a first input terminal coupled to an output terminal of the fourth AND gate, and a second input terminal receiving the fifth bit of the counting value. An inverter is coupled to an output terminal of the third OR gate for outputting the second up signal.

In some embodiments, the first comparing circuit includes following units. A first comparator has an inverting input terminal coupled to a first predetermined voltage, a non-inverting input terminal receiving the first voltage signal, and an output terminal outputting the first up signal. A second comparator has an inverting input terminal coupled to the first voltage signal, a non-inverting input terminal coupled to a second predetermined voltage, and an output terminal outputting the first down signal. The second predetermined voltage is lower than the first predetermined voltage.

In some embodiments, the selection circuit includes following units. A first P-type transistor has a gate coupled to a first control voltage, and a source coupled to an operation voltage. A second P-type transistor has a gate receiving the second up signal through a first inverter, and a source coupled to a drain of the first P-type transistor. A first N-type transistor has a gate receiving the second down signal, and a drain coupled to a drain of the second P-type transistor. A second N-type transistor has a gate coupled to a second control voltage, a drain coupled to a source of the first N-type transistor, and a source coupled to a ground voltage. A third P-type transistor has a source coupled to the operation voltage, and a gate coupled to the first control voltage. A fourth P-type transistor has a source coupled to a drain of the third P-type transistor, and a gate receiving the first up signal through a second inverter. A third N-type transistor has a drain coupled to a drain of the fourth P-type transistor, and a gate receiving the first down signal. A fourth N-type transistor has a drain coupled to a source of the third N-type transistor, a gate receiving the second control voltage, and a source coupled to the ground voltage. A capacitor has a first terminal coupled to the drain of the second P-type transistor and the drain of the fourth P-type transistor, and a second terminal coupled to the ground voltage. The first terminal of the capacitor outputs the second voltage signal.

In some embodiments, sizes of the first P-type transistor, the second P-type transistor, the first N-type transistor and the second N-type transistor are larger than sizes of the third P-type transistor, the fourth P-type transistor, the third N-type transistor and the fourth N-type transistor.

In some embodiments, the voltage controlled oscillator includes following units. A first bias voltage generator generates a first bias voltage and a second bias voltage according to the first voltage signal. A second bias voltage generator generates a third bias voltage and a fourth bias voltage according to the second voltage signal. A ring oscillator generates the clock signal according to the first bias voltage, the second bias voltage, the third bias voltage and the fourth bias voltage.

In some embodiments, the first bias voltage generator includes following units. A first P-type transistor has a gate coupled to the first voltage signal. A second P-type transistor has a source coupled to a source of the first P-type transistor. A first N-type transistor has a gate coupled to the first voltage signal, a drain coupled to a gate of the second P-type transistor, and a source coupled to a ground voltage. A second N-type transistor has a drain coupled to a drain of the first P-type transistor, a source coupled to the ground voltage, and a gate coupled to the drain of the second N-type transistor. The gate of the second N-type transistor outputs the first bias voltage. A third N-type transistor has a drain coupled to a drain of the second P-type transistor, a source coupled to the ground voltage, and a gate coupled to the drain of the third N-type transistor. The gate of the third N-type transistor outputs the second bias voltage. A first current source is coupled between the source of the first P-type transistor and the operation voltage. A first resistor is coupled between the operation voltage and the drain of the first N-type transistor.

In some embodiments, the second bias voltage generator includes following units. A third P-type transistor has a gate coupled to the second voltage signal. A fourth P-type transistor has a source coupled to a source of the third P-type transistor. A fourth N-type transistor has a gate receiving to the second voltage signal, a drain coupled to a gate of the fourth P-type transistor, and a source coupled to the ground voltage. A fifth N-type transistor has a drain coupled to a drain of the third P-type transistor, a source coupled to the ground voltage, and a gate coupled to the drain of the fifth N-type transistor, wherein the gate of the fifth N-type transistor outputs the third bias voltage. A sixth N-type transistor has a drain coupled to a drain of the fourth P-type transistor, a source coupled to the ground voltage, and a gate coupled to the drain of the sixth N-type transistor. The gate of the sixth N-type transistor outputs the fourth bias voltage. A second current source is coupled between the source of the third P-type transistor and the operation voltage. A second resistor is coupled between the operation voltage and the drain of the fourth N-type transistor.

In some embodiments, the ring oscillator includes M delay units. M is a positive integer greater than 1. Each of the delay units has a differential input terminal and a differential output terminal. The differential output terminal of an $i^{th}$ delay unit is coupled to the differential input terminal of an $(i+1)^{th}$ delay unit, in which i is a positive integer less than M. The differential output terminal of $M^{th}$ delay unit is coupled to the differential input terminal of a $1^{st}$ delay unit. Each of the M delay units outputs the clock signal through the differential output terminal according to the first bias voltage, the second bias voltage, the third bias voltage and the fourth bias voltage.

Embodiments of the invention also provide an electronic device includes the aforementioned clock and data recovery circuit.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
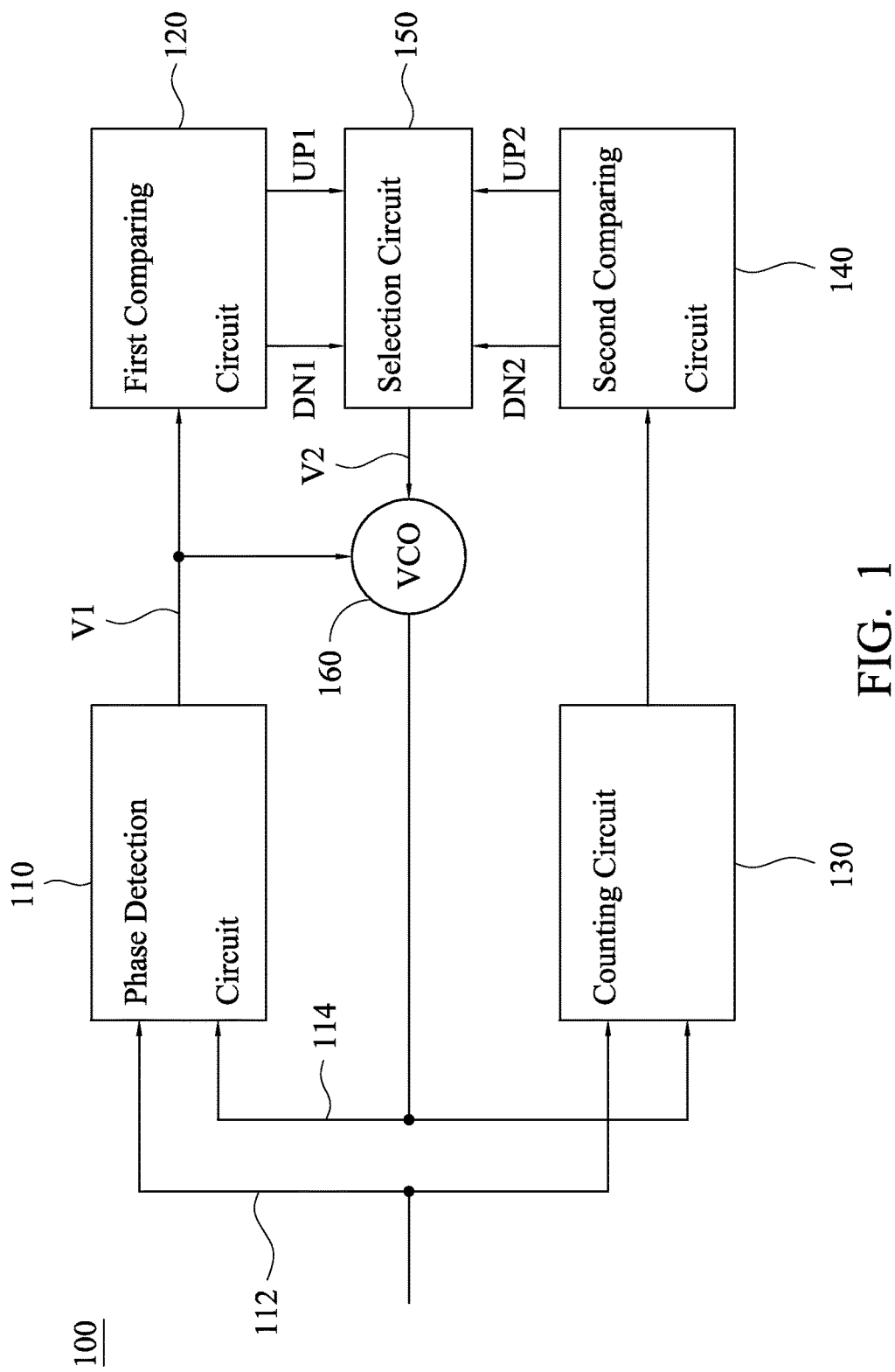
FIG. 1 is a diagram illustrating a CDR circuit according to an embodiment of the invention.

FIG. 1 is a diagram illustrating a CDR circuit according to an embodiment of the invention. Referring to FIG. 1, a CDR circuit 100 includes a phase detection circuit 110, a first comparing circuit 120, a counting circuit 130, a second comparing circuit 140, a selection circuit 150 and a VCO 160.

The phase detection circuit 110 receives an input signal 112 and a clock signal 114, and detects a phase difference and/or a frequency difference between the input signal 112 and the clock signal 114 to output a first voltage signal V1. The phase detection circuit 110 may include a phase detector, a charge bump, a low pass filter, etc. In general, the phase detection circuit 110 is capable of precisely tracing the frequency of the input signal 112 but has limited frequency range. For example, a rotational frequency detector (RFD)

may be used in the phase detection circuit 110, in which the correct frequency range of the RFD is within +50% to −50% of the input frequency.

The first comparing circuit 120 is coupled to the phase detection circuit 110 for determining whether the first voltage signal V1 is within a voltage range to output a first up signal UP1 and a first down signal DN1. For example, if the first voltage signal V1 is within the voltage range, then the first up signal UP1 and the first down signal DN1 are disabled (e.g. at a logical low level); and if the first voltage signal V1 is not within the voltage range, one of the first up signal UP1 and the first down signal DN1 are enabled (e.g. at a logical high level), and the other one is disabled.

The counting circuit 130 receives the input signal 112 and the clock signal 114. The counting circuit 130 takes one of the input signal 112 and the clock signal 114 as a reset signal, and takes the other one as a trigger signal. In addition, the counting circuit 130 updates a counting value according to the reset signal and the trigger signal. For example, when the trigger signal is at a rising edge and the reset signal is logical high, then the counting value is increased by 1. Note that when the frequency of the trigger signal is higher, the accumulated counting value is greater; and when the frequency of the reset signal is lower, the accumulated counting value is greater. Therefore, the counting value can be used to determine whether the frequency of the input signal 112 is higher/lower than that of the clock signal 114. In addition, the frequency range of the counting circuit 130 is unlimited. The detail will be described below.

The second comparing circuit 140 is coupled to the counting circuit 130 for determining whether the counting value is within a value range to output a second up signal UP2 and a second down signal DN2. For example, if the counting value is within the value range, then the second up signal UP2 and the second down signal DN2 are disabled; and if the counting value is not within the value range, then one of the second up signal UP2 and the second down signal DN2 is enabled, and the other one is disabled.

The selection circuit 150 is coupled to the first comparing circuit 120 and the second comparing circuit 140. The selection circuit 150 outputs a second voltage signal V2 according to the first up signal UP1, the first down signal DN1, the second up signal UP2 and the second down signal DN2. The VCO 160 is coupled to the phase detection circuit 110 and the selection circuit 150 for outputting the clock signal 114 according to the first voltage signal V1 and the second voltage signal V2.

In the embodiment, the first voltage signal V1 is taken as a fine adjustment, and the second voltage signal V2 is taken as a coarse adjustment. When the CDR circuit 100 is started up, the CDR circuit 100 first judges the frequency relationship between the input signal 112 and the clock signal 114 through the counting circuit 130. Once the frequency error is out of the frequency range of the phase detection circuit 110, the counting circuit 130 dominates the frequency tracking process. Then, it changes the frequency of the clock signal 114 through the second voltage signal V2 and substantially reduces the frequency. The first voltage signal V1 is used to track the low frequency error and phase error. In order to avoid that the counting circuit 130 has a great effect when the frequency error is within +50% to −50%, the current produced by the second up signal UP2 and the second down signal DN2 is less than the current produced by the first up signal UP1 and the first down signal DN1 in the selection circuit 150. When the frequency error is small enough, the second up signal UP2 and the second down signal DN2 are both disabled to affect the frequency tracing process. Therefore, the counting circuit 130 has no effect on the typical phase detection circuit 110 unless a giant phase error occurs. Accordingly, the CDR circuit 100 provides unlimited frequency range and precise frequency tracing at the same time.

Figure 2:
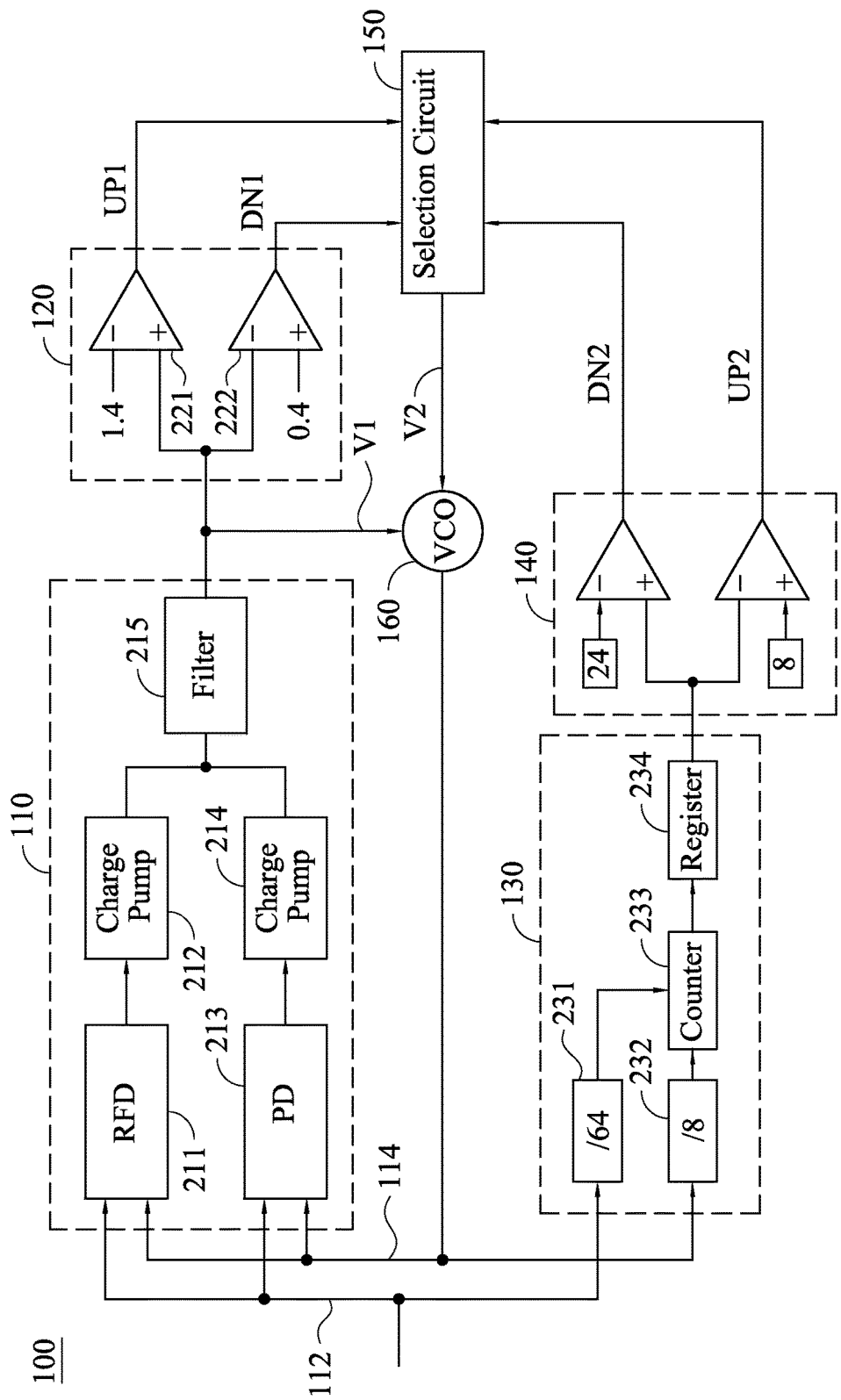
FIG. 2 is a diagram illustrating the CDR circuit according to another embodiment of the invention.

FIG. 2 is a diagram illustrating the CDR circuit 100 according to an embodiment of the invention. Referring to FIG. 2, the counting circuit 130 includes a first divider 231, a second divider 232, a counter 233 and a register 234. The first divider 231 receives the input signal 112, and divides the input signal 112 by a first number to generate the reset signal. The second divider 232 receives the clock signal 114 and divides the clock signal 114 by a second number to generate the trigger signal. The second number is less than the first number. For example, the first number is equal to 64, and the second number is equal to 8. The counter 233 are coupled to the first divider 231 and the second divider 232 for updating the counting value according to the trigger signal and the reset signal. The register 234 is coupled to the counter 233 for storing the counting value. The detail of the counting circuit 130 will be described in following paragraphs.

Figure 3:
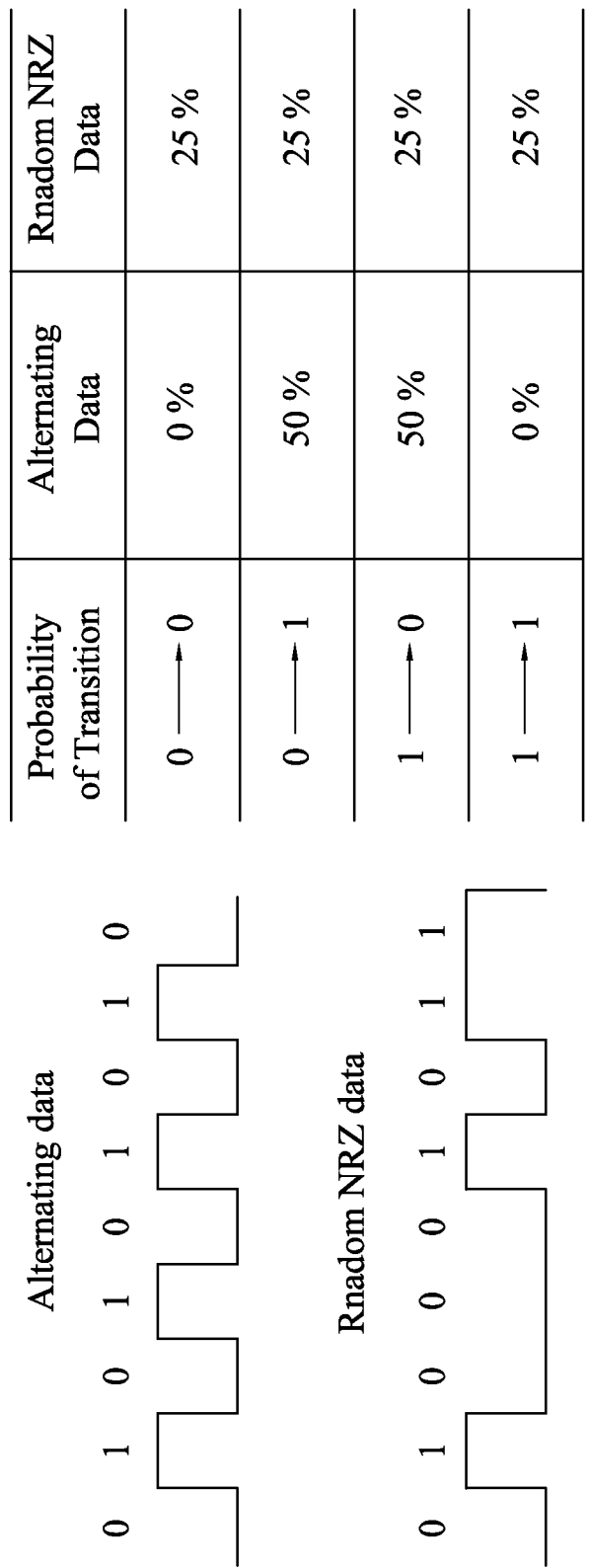
FIG. 3 is a diagram illustrating alternating data and random NRZ data.
Figure 4:
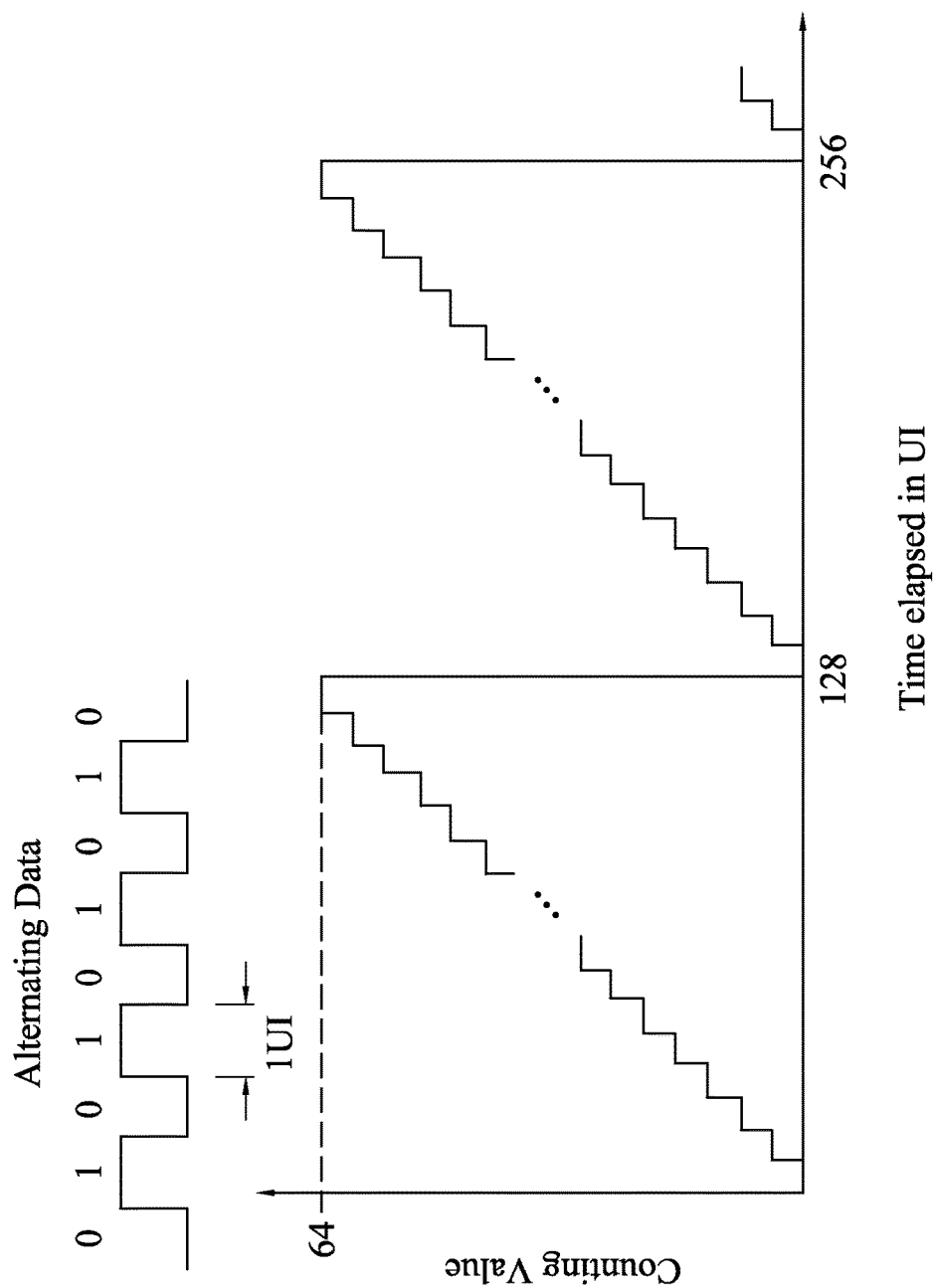
FIG. 4 is a diagram illustrating an accumulation process of the alternating data.
Figure 5:
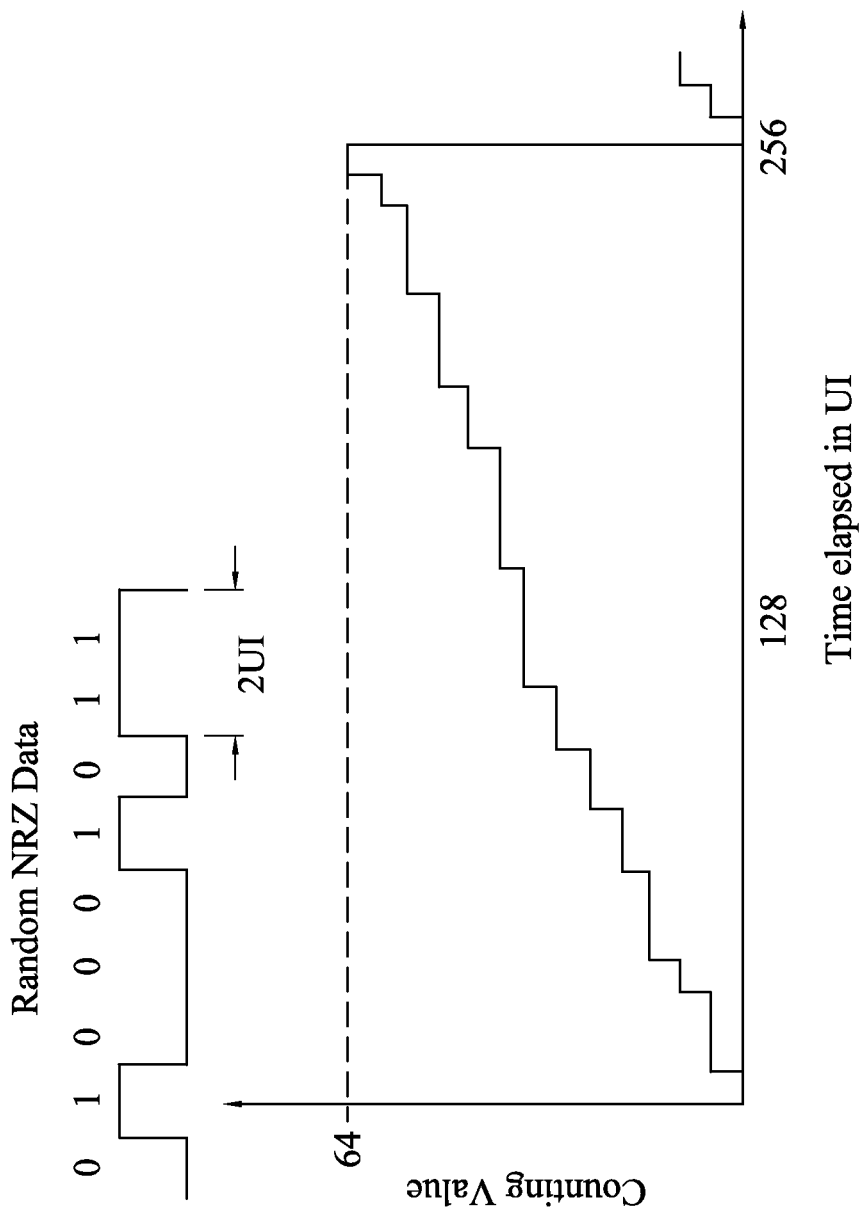
FIG. 5 is a diagram illustrating an accumulation process of the random NRZ data.

At first, two data formats are assumed. As shown in FIG. 3, for alternating data, both the probability of changing from "1" to "0" and the probability of changing from "0" to "1" are equal to 0.5, and the transition from "0" to "0" or from "1" to "1" never occurs (i.e. the transition probabilities are zero). The alternating data behaves like a clock signal. On the other hand, for random non-return-to-zero (NRZ) data, all four possible transitions listed in FIG. 3 may occur and the four possibilities are all 0.25. Using these results, a digital accumulator can be used to assist the implementation of a frequency detector. In FIG. 4 and FIG. 5, a 5-bit counter, clocked by these two different data formats, is realized to be a digital accumulator. In FIG. 4, the trigger signal is the alternating data and the counter is triggered by the positive edge, the time taken to count from 0 to 64 is 128 unit intervals (UI). In other words, when clocked with the alternating data, the counter roll-over happens every 128 UI. In the case of FIG. 5, the same counter is clocked with the random NRZ data. Because the transition probability from "0" to "1" is half of that in the alternating data, the time taken to count from 0 to 64 is 256 UI. As a result, the counter roll-over happens every 256 UI in FIG. 5. Also note that the "1" state of the alternating data lasts 1 UI, and the "1" state of the random NRZ data lasts 2 UI in average.

Figure 6:
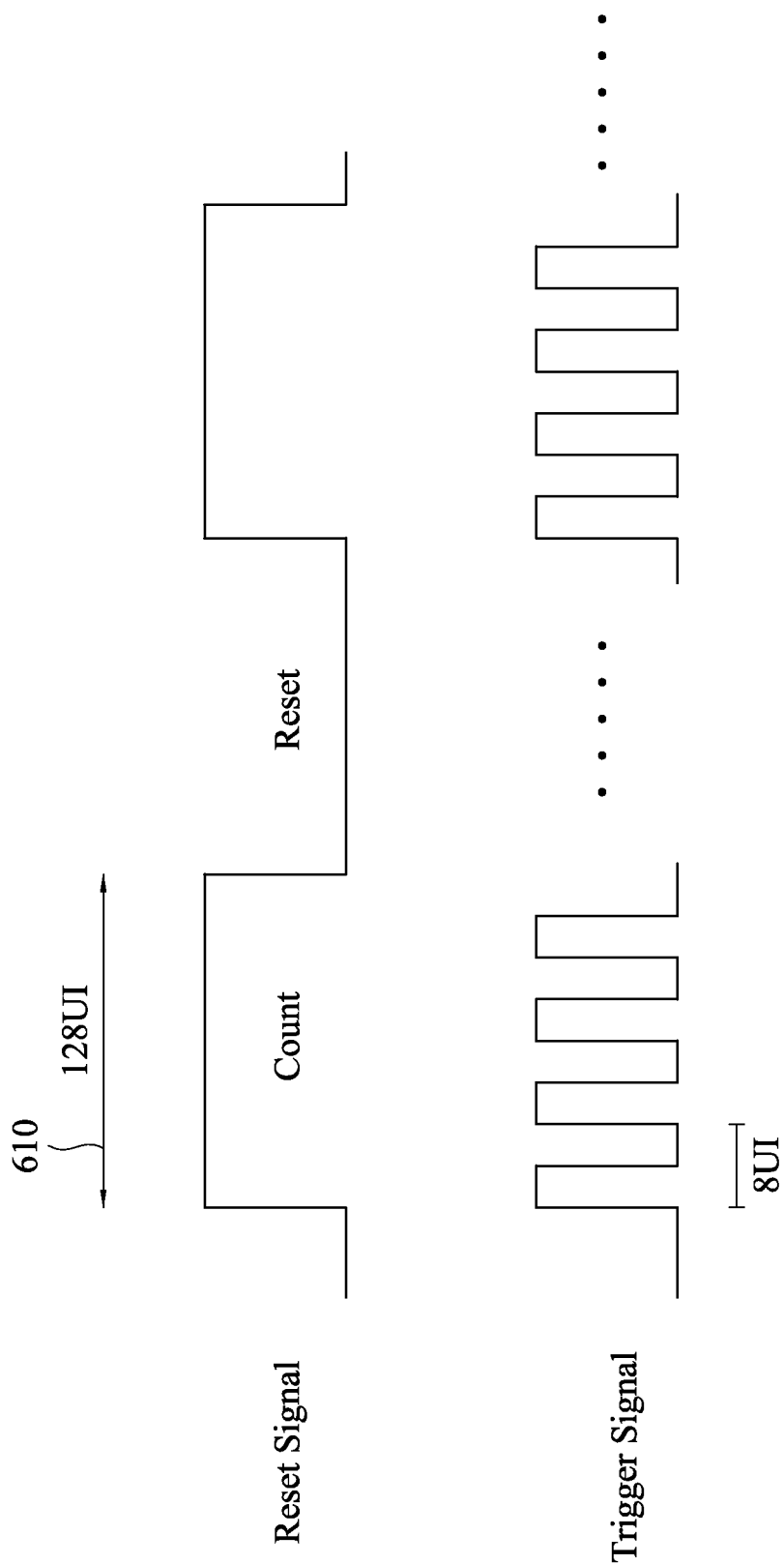
FIG. 6 is a timing diagram of a counter according to an embodiment of the invention.

Referring to FIG. 2 and FIG. 6, the input signal 112 is considered as the random NRZ data which is divided by 64 to act as the reset signal. Since the "1" state of the random NRZ data lasts 2 UI in average, the length of a counting period 610 is equal to 64×2=128 UI in average. In addition, the clock signal 114 is considered as the alternating data which is divided by 8 to act as the trigger signal. Therefore, it takes 8 UI for the trigger signal to change from "0" to "1". As a result, during the counting period 610, the trigger signal should trigger the counter 233 for 128/8=16 times. If the counting value of the counter 233 is less than 16, it means the clock signal 114 is slower than the input signal 112. In the contrast, if the counting value of the counter 233 is greater than 16, it means the clock signal 114 is faster than the input signal 112.

In the embodiment of FIG. 2, the input signal 112 is divided by 64, the clock signal 114 is divided by 8, and the register 234 has 5 bits. However, the invention is not limited thereto, and the numbers may be designed according to practical requirement. For example, if the input signal 112 is divided by 256 and the clock signal 114 is divided by 16, then the register 234 may have 6 bits. In other embodiments, the input signal 112 may be taken as the trigger signal, and the clock signal 114 may be taken as the reset signal. Note that when the input signal 112 is taken as the trigger signal and divided by a number (e.g. 64), the clock signal 114 should be divided by a larger number (e.g. 256) to act as the rest signal.

The second comparing circuit 140 determines whether the counting value is greater than a first predetermined value, and determines whether the counting value is less than a second predetermined value. The first predetermined value is greater than the second predetermined value. For example, the first predetermined value is equal to 24, and the second predetermined value is equal to 8, but the invention is not limited thereto. If the counting value is greater than the first predetermined value, the second comparing circuit 140 enables (e.g. set as logical high) the second down signal DN2 and disables (e.g. set as logical low) the second up signal UP2. If the counting value is less than the first predetermined value and greater than the second predetermined value, the second comparing circuit 140 disables the second down signal DN2 and the second up signal UP2. If the counting value is less than the second predetermined value, the second comparing circuit 140 enables the second up signal UP2 and disables the second down signal DN2.

Figure 7:
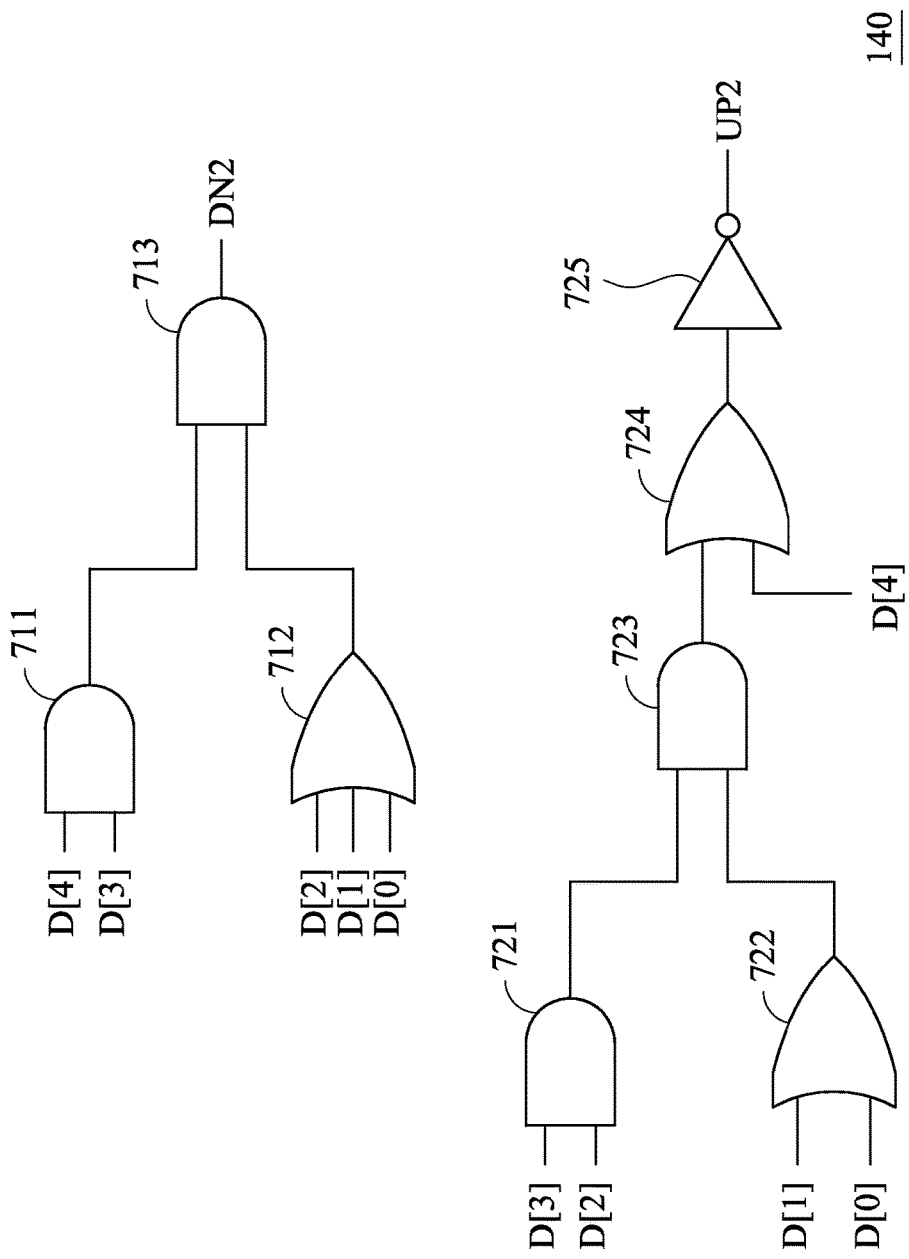
FIG. 7 is a diagram illustrating an implementation of a second comparing circuit according to an embodiment of the invention.

Note that the second comparing circuit 140 illustrated in FIG. 2 is just schematic. In some embodiments, the second comparing circuit 140 may be implemented by several logic gates. FIG. 7 shows an implementation of the second comparing circuit 140 according to an embodiment of the invention. In this example, the counting value has 5 bits, D[0] denotes the first bit, D[1] denotes the second bit, and so on. In addition, D[4] is the most significant bit (MSB), and D[0] is the least significant bit (LSB). A first AND gate 711 has two input terminals respectively receiving the fourth bit D[3] and the fifth bit D[4]. A first OR gate 712 has three input terminals respectively receiving the first bit D[0], the second bit D[1] and the third bit D[2]. A second AND gate 713 has two input terminals respectively coupled to an output terminal of the first AND gate 711 and an output terminal of the first OR gate 712. An output terminal of the AND gate 713 outputs the second down signal DN2. A third AND gate 721 has two input terminals receiving the third bit D[2] and the fourth bit D[3]. A second OR gate 722 has two input terminals receiving the first bit D[0] and the second bit D[1]. A fourth AND gate 723 has two input terminals coupled to an output terminal of the third AND gate 721 and an output terminal of the second OR gate 722. A third OR gate has a first input terminal coupled to an output terminal of the fourth AND gate 723, and a second input terminal receiving the fifth bit D[4]. An inverter 725 has an input terminal coupled to an output terminal of the third OR gate 725, and an output terminal outputting the second up signal UP2.

Referring to FIG. 2 again, the phase detection circuit 110 includes a rotational frequency detector (RFD) 211, a charge pump 212, a phase detector (PD) 213, a charge pump 214 and a filter 215. The rotational frequency detector 211 and the phase detector 213 detect the frequency difference or the phase difference between the input signal 112 and the clock 114. The charge pump 212 is coupled between the rotational frequency detector 211 and the filter 215. The charge pump 214 is coupled between the phase detector 213 and the filter 215. The filter 215 is coupled to the charge pump 212 and 214 for outputting the first voltage signal V1.

The first comparing circuit 120 includes a first comparator 221 and a second comparator 222. The first comparator 120 has an inverting input terminal coupled to a first predetermined voltage, a non-inverting input terminal receiving the first voltage signal V1, and an output terminal outputting the first up signal UP1. The second comparator 222 has an inverting input terminal coupled to the first voltage signal V1, a non-inverting input terminal coupled to a second predetermined voltage, and an output terminal outputting the first down signal DN1. The second predetermined voltage is lower than the first predetermined voltage. For example, the first predetermined voltage is equal to 1.4 volt (V), and the second predetermined voltage is equal to 0.4 V.

Figure 8:
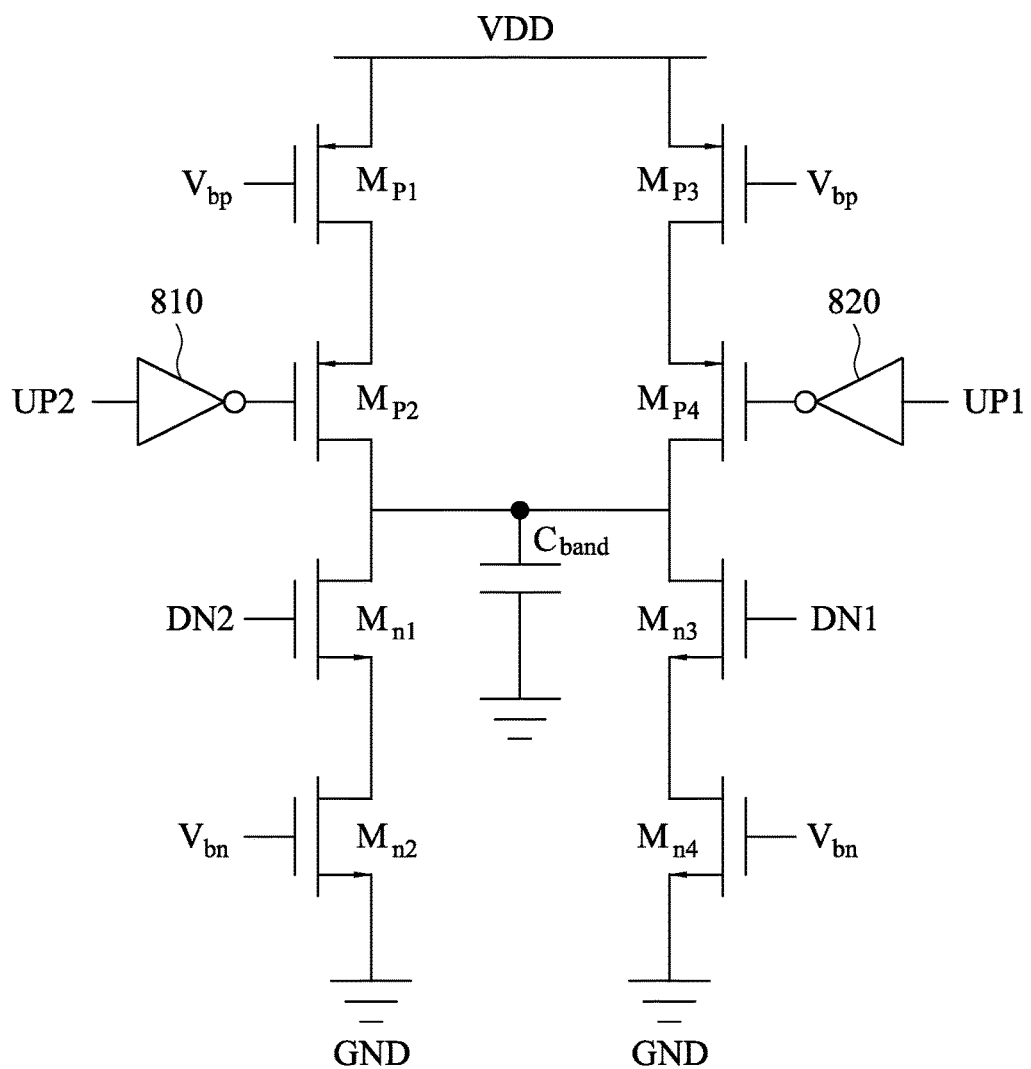
FIG. 8 is a diagram illustrating a selection circuit according to an embodiment of the invention.

FIG. 8 is a diagram illustrating the selection circuit 150 according to an embodiment of the invention. Referring to FIG. 8, the selection circuit 150 is configured to generate the second voltage signal V2 according to the first up signal UP1, the first down signal DN1, the second up signal UP2 and the second down signal DN2. To be specific, a first P-type transistor $M_{p1}$ has a gate coupled to a first control voltage $V_{bp}$, and a source coupled to an operation voltage VDD. A second P-type transistor $M_{p2}$ has a gate receiving the second up signal UP2 through a first inverter 810, and a source coupled to a drain of the first P-type transistor $M_{p1}$. A first N-type transistor $M_{n1}$ has a gate receiving the second down signal DN2, and a drain coupled to a drain of the second P-type transistor $M_{p2}$. A second N-type transistor $M_{n2}$ has a gate coupled to a second control voltage $V_{bn}$, a drain coupled to a source of the first N-type transistor $M_{n1}$, and a source coupled to a ground voltage GND. A third P-type transistor $M_{p3}$ has a source coupled to the operation voltage VDD, and a gate coupled to the first control voltage $V_{bp}$. A fourth P-type transistor $M_{p4}$ has a source coupled to a drain of the third P-type transistor $M_{p3}$, a gate receiving the first up signal UP1 through a second inverter 820. A third N-type transistor $M_{n3}$ has a drain coupled to a drain of the fourth P-type transistor $M_{p4}$, a gate receiving the first down signal DN1. A fourth N-type transistor $M_{n4}$ has a drain coupled to a source of the third N-type transistor $M_{n3}$, a gate receiving the second control voltage $V_{bn}$, and a source coupled to the ground voltage GND. A first terminal of a capacitor $C_{band}$ is coupled to the drain of the second P-type transistor $M_{p2}$ and the drain of the fourth P-type transistor $M_{p4}$. A second terminal of the capacitor $C_{band}$ is coupled to the ground voltage GND. The first terminal of the capacitor $C_{band}$ outputs the second voltage signal V2.

When the first up signal UP1 or the second up signal UP2 is at a high level, the transistor $M_{p2}$ or $M_{p4}$ is turned on, and thus the capacitor $C_{band}$ is charged. When the first down signal DN1 or the second down signal DN2 is at the high level, the transistor $M_{n1}$ or $M_{n3}$ is turned on, and thus the capacitor $C_{band}$ is discharged. The first control voltage $V_{bp}$ and the second control voltage $V_{bn}$ are used for adjusting the magnitude of the current, and they may be designed according to practical requirement. In the embodiment, the sizes (e.g. W/L ratios) of the transistors $M_{p1}$, $M_{p2}$, $M_{n1}$, and $M_{n2}$ are larger than that of the transistors $M_{p3}$, $M_{p4}$, $M_{n3}$, and $M_{n4}$. Therefore, the second up signal UP2 and the second down signal DN2 produce larger current than that of the first up signal UP1 and the first down signal DN1.

Figure 9:
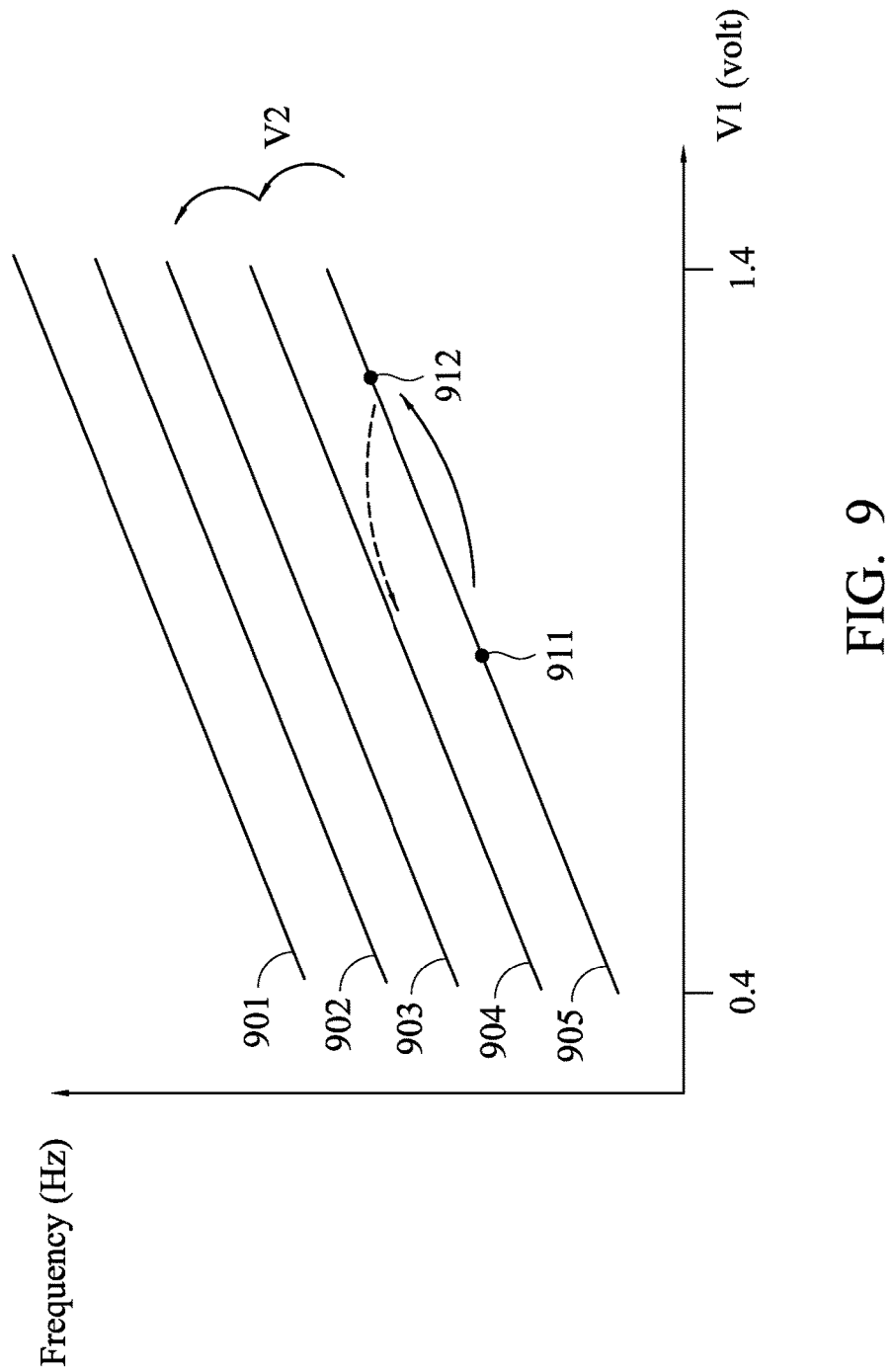
FIG. 9 is a chart showing functions of the first voltage signal V1 and the second voltage signal V2.

The functions of the first voltage signal V1 and the second voltage signal V2 can be described in FIG. 9, in which the horizontal axis represents the first voltage signal V1, and the horizontal axis represents the frequency of the clock signal 114. The second voltage signal V2 is used for a coarse tune of the frequency, and it switches between bands 901-905. In other words, the selection circuit 150 selects one of the bands 901-905 according to the second voltage signal V2. The first voltage signal V1 is used for a fine tune of the frequency, for example, moving from an operation point 911 to an operation point 912. When the first voltage signal V1 is greater than the first predetermined voltage (e.g. 1.4V) or less than the second predetermined voltage (e.g. 0.4V), the first up signal UP1 or the first down signal DN1 is enabled, and thus the capacitor $C_{band}$ is charged/discharged and the second voltage signal V2 is adjusted to switch to a higher or lower band. For example, starting from the operation point 912, when the first voltage signal V1 is greater than the first predetermined voltage, it switches from the right end of the band 905 to the center of the band 904.

Figure 10:
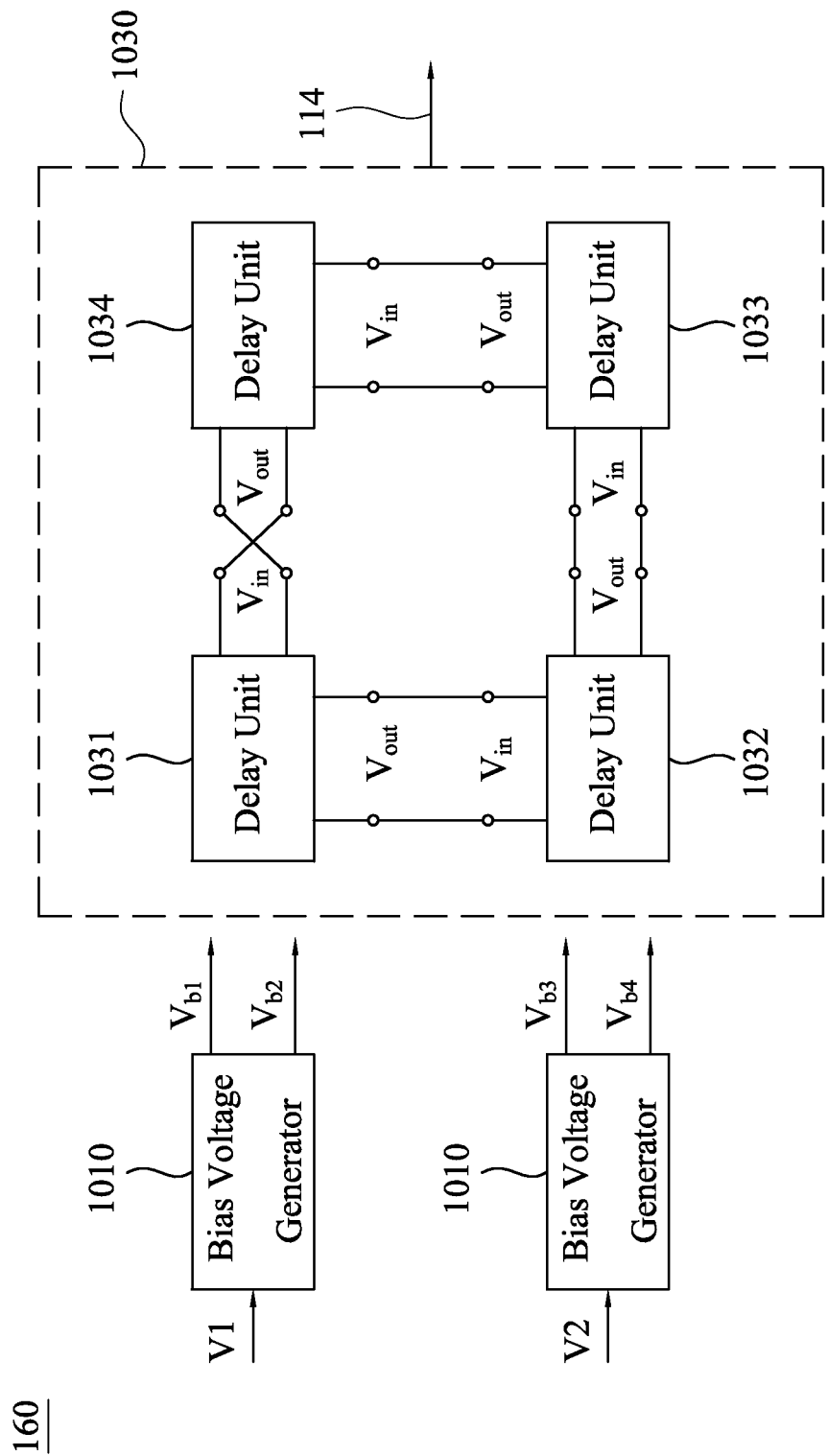
FIG. 10 is a diagram illustrating a voltage controlled oscillator according to an embodiment of the invention.

FIG. 10 is a diagram illustrating the voltage controlled oscillator according to an embodiment of the invention. Referring to FIG. 10, the VCO 160 includes a first bias voltage generator 1010, a second bias voltage generator 1020 and a ring oscillator 1030. The first bias voltage generator 1010 generates a first bias voltage $V_{b1}$ and a second bias voltage $V_{b2}$ according to the first voltage signal V1. The second bias voltage generator 1020 generates a third bias voltage $V_{b3}$ and a fourth bias voltage $V_{b4}$ according to the second voltage signal V2. The ring oscillator 1030 generates the clock signal according to the bias voltage $V_{b1}$ to $V_{b4}$. To be specific, the ring oscillator 1030 includes M delay units 1031-1033. M is a positive integer greater than 1. For example, M is equal to 4 in the embodiment. Each of the delay units 1031-1033 has a differential input terminal $V_{in}$ and a differential output terminal $V_{out}$. The differential output terminal $V_{out}$ of an $i^{th}$ delay unit is coupled to the differential input terminal $V_{in}$ of an $(i+1)^{th}$ delay unit, in which i is a positive integer less than M. The differential output terminal $V_{out}$ of $M^{th}$ delay unit is inversely coupled to the differential input terminal $V_{in}$ of a $1^{st}$ delay unit. For example, the differential output terminal $V_{out}$ of the delay unit 1034 is inversely coupled to the differential input terminal $V_{in}$ of the delay unit 1031. Each delay unit outputs the clock signal 114 through the differential output terminal $V_{out}$ according to the bias voltage $V_{b1}$ to $V_{b4}$.

Figure 11A:
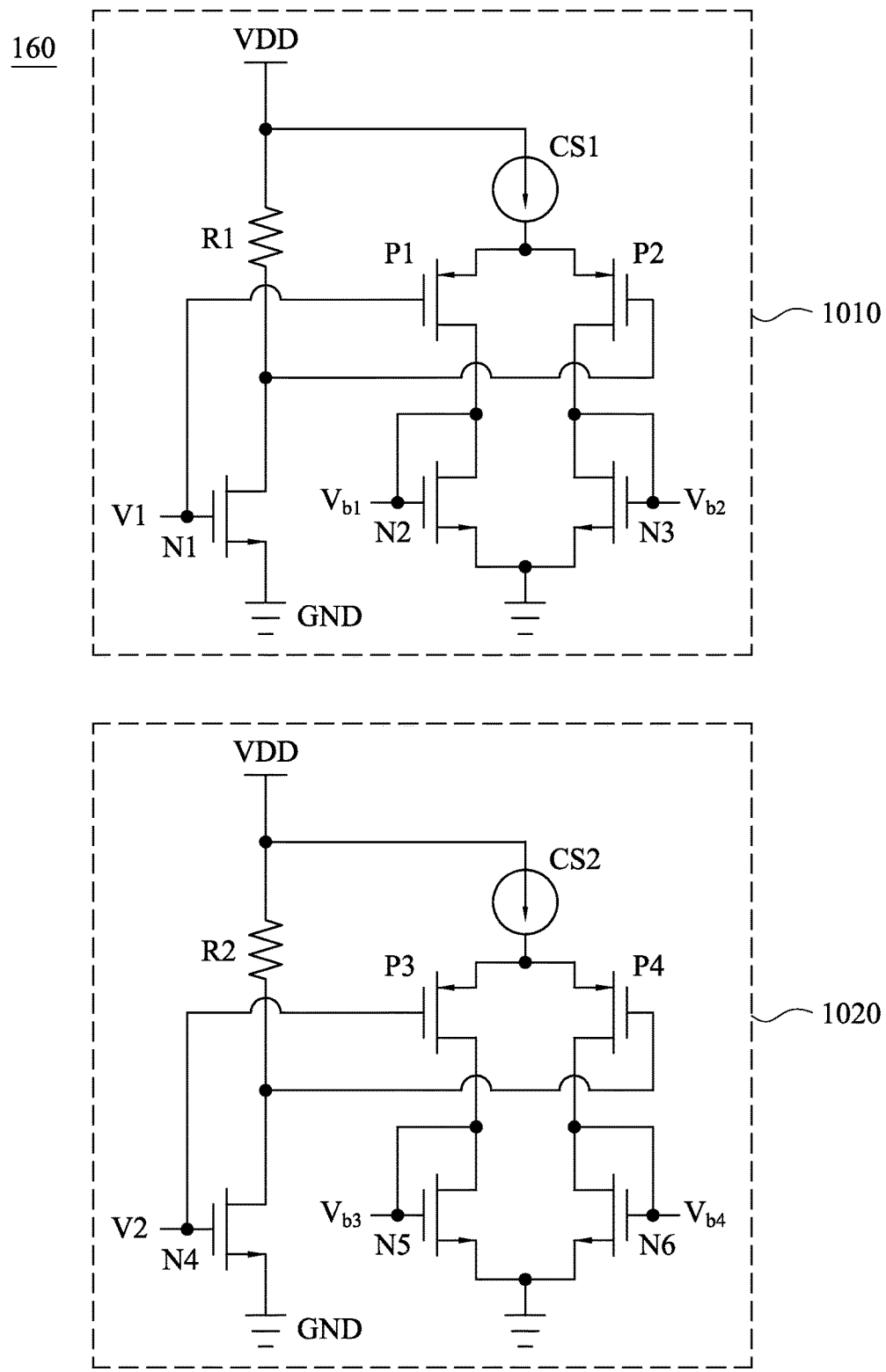
FIG. 11A is a diagram illustrating a first bias voltage generator and a second bias voltage generator according to an embodiment of the invention.
Figure 11B:
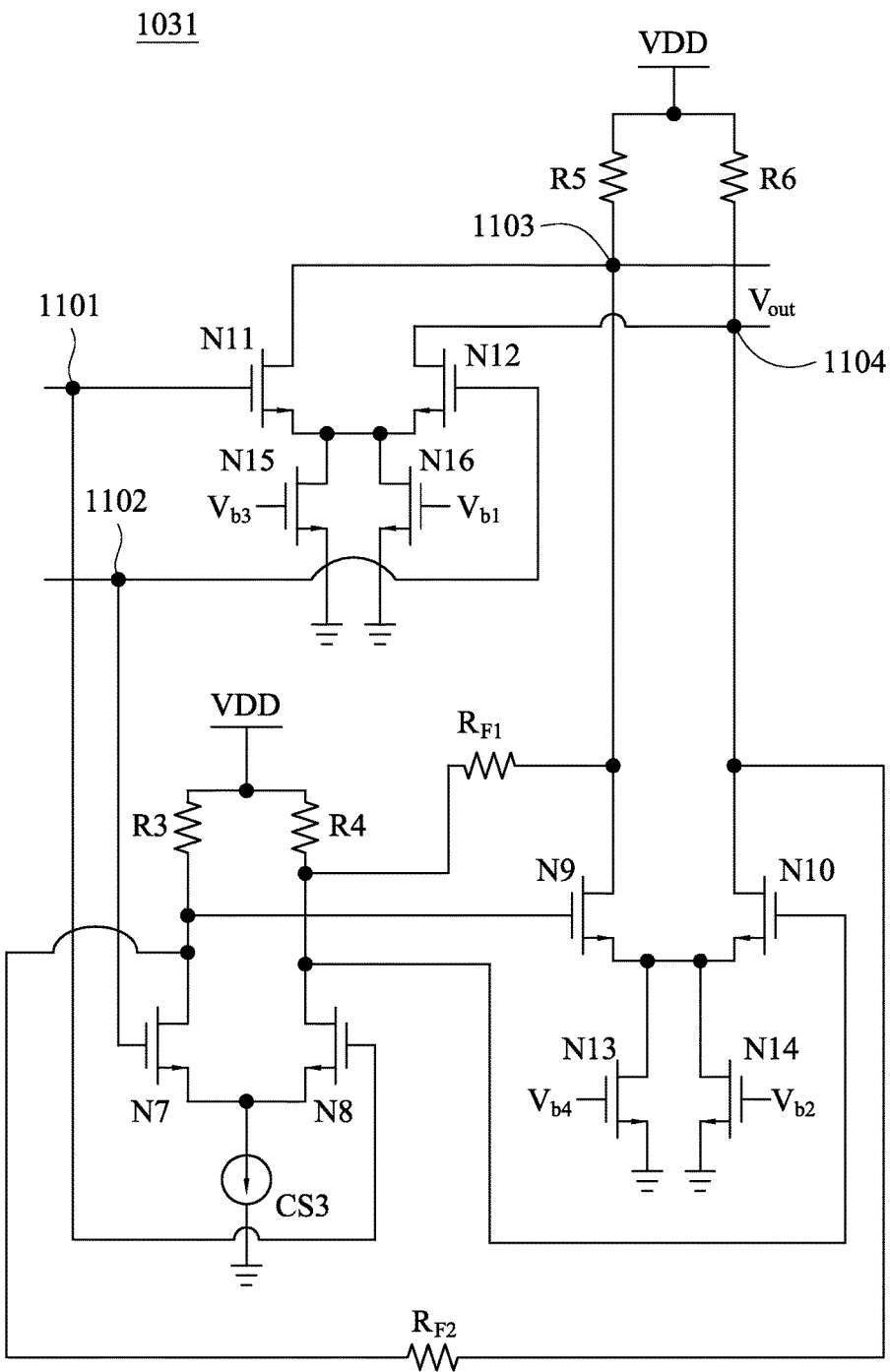
FIG. 11B is a diagram illustrating a delay unit of the ring oscillator according to an embodiment of the invention.

FIG. 11A is a diagram illustrating a first bias voltage generator and a second bias voltage generator according to an embodiment of the invention. FIG. 11B is a diagram illustrating a delay unit of the ring oscillator according to an embodiment of the invention.

Referring to FIG. 11A and FIG. 11B, the first bias voltage generator 1010 includes following units. A first P-type transistor P1 has a gate coupled to the first voltage signal V1. A second P-type transistor P2 has a source coupled to a source of the first P-type transistor P1. A first N-type transistor N1 has a gate coupled to the first voltage signal V1, a drain coupled to a gate of the second P-type transistor P2, and a source coupled to the ground voltage GND. A second N-type transistor N2 has a drain coupled to the drain of the first P-type transistor P1, a source coupled to the ground voltage GND, and a gate coupled to the drain of the second N-type transistor N2. In addition, the gate of the second N-type transistor N2 outputs the first bias voltage $V_{b1}$. A third N-type transistor N3 has a drain coupled to the drain of the second P-type transistor P2, a source coupled to the ground voltage GND, and a gate coupled to the drain of the third N-type transistor N3. Besides, the gate of the third N-type transistor N3 outputs the second bias voltage $V_{b2}$. A first current source CS1 is coupled between the source of the first P-type transistor P1 and the operation voltage VDD. A first resistor R1 is coupled between the operation voltage VDD and the drain of the first N-type transistor N1.

The second bias voltage generator 1020 includes following units. A third P-type transistor P3 has a gate coupled to the second voltage signal V2. A fourth P-type transistor P4 has a source coupled to the source of the third P-type transistor P3. A fourth N-type transistor has a gate receiving to the second voltage signal V2, a drain coupled to the gate of the fourth P-type transistor P4, and a source coupled to the ground voltage GND. A fifth N-type transistor N5 has a drain coupled to the drain of the third P-type transistor P3, a source coupled to the ground voltage GND, and a gate coupled to the drain of the fifth N-type transistor N5. In addition, the gate of the fifth N-type transistor N5 outputs the third bias voltage $V_{b3}$. A sixth N-type transistor, having a drain coupled to a drain of the fourth P-type transistor, a source coupled to the ground voltage, and a gate coupled to the drain of the sixth N-type transistor, wherein the gate of the sixth N-type transistor outputs the fourth bias voltage. A second current source CS2 is coupled between the source of the third P-type transistor P3 and the operation voltage VDD. A second resistor R2 is coupled between the operation voltage VDD and the drain of the fourth N-type transistor N4.

The delay units 1031-1034 have the same circuit structure, and herein the delay unit 1031 is taken as an example. The differential input terminal $V_{in}$ has a first terminal 1101 and a second terminal 1102, and the differential output terminal $V_{out}$ has a first terminal 1103 and a second terminal 1104. The gate of a seventh N-type transistor is coupled to the first terminal 1101. The gate of an eighth N-type transistor N8 is coupled to the second terminal 1102. A source of the eighth N-type transistor N8 is coupled to the source of the seventh N-type transistor N7. A third current source CS3 is coupled between the source of the seventh N-type transistor N7 and the ground voltage. The gate of a ninth N-type transistor N9 is coupled to the drain of the seventh N-type transistor N7. The gate of a tenth N-type transistor N10 is coupled to the drain of the eighth N-type transistor N8. A drain of the ninth N-type transistor N9 is coupled to a first terminal 1103. The drain of the tenth N-type transistor N10 is coupled to the second terminal 1104. The source of the ninth N-type transistor N9 is coupled to the source of the tenth N-type transistor N10. A thirteenth N-type transistor N13 has a drain coupled to the source of the ninth N-type transistor N9, a source coupled to the ground voltage, and a gate coupled to the fourth bias voltage $V_{b4}$. A fourteenth N-type transistor N14 has a drain coupled to the source of the tenth N-type transistor N10, a source coupled to the ground voltage, and a gate coupled to the second bias voltage $V_{b2}$. An eleventh N-type transistor N11 has a gate coupled to the first terminal 1101, and a drain coupled to the terminal 1103. A twelfth N-type transistor N12 has a gate coupled to the second terminal 1102, and a drain coupled to the terminal 1104. A fifteenth N-type transistor N15 has a drain coupled to the source of the eleventh N-type transistor N11, a source coupled to the ground voltage, and a gate coupled to the third bias voltage $V_{b3}$. A sixteenth N-type transistor N16 has a drain coupled to the source of the twelfth N-type transistor N12, a source coupled to the ground voltage, and a gate coupled to the first bias voltage $V_{b1}$. A third resistor R3 is coupled between the drain of the seventh N-type transistor N7 and the operation voltage VDD. A fourth resistor R4 is coupled between the drain of the eighth N-type transistor N8 and the operation voltage VDD. A fifth resistor R5 is coupled between the drain of the ninth N-type transistor N9 and the operation voltage VDD. A sixth resistor R6 is coupled between the drain of the tenth N-type transistor N10 and the operation voltage VDD. A first feedback resistor $R_{F1}$ is coupled between the drain of the eighth N-type transistor N8 and the drain of the ninth N-type transistor N9. A second feedback resistor $R_{F2}$ is coupled between the drain of the seventh N-type transistor N7 and the drain of the tenth N-type transistor N10.

An electronic device including the CDR circuit 100 is also provided. The electronic device may be implemented as a transmission interface complying with standards such as USB, HDMI or SATA. Alternatively, the electronic device may also be implemented as a user-end device such as a computer, a smart phone, etc.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A clock and data recovery circuit, comprising:
    a phase detection circuit, configured to receive an input signal and a clock signal, and to detect a phase difference between the input signal and the clock signal to output a first voltage signal;
    a first comparing circuit, coupled to the phase detection circuit, and configured to determine whether the first voltage signal is within a voltage range to output a first up signal and a first down signal;
    a counting circuit, configured to receive the input signal and the clock signal, take one of the input signal and the clock signal as a reset signal, take another one of the input signal and the clock signal as a trigger signal, and update a counting value according to the reset signal and the trigger signal;
    a second comparing circuit, coupled to the counting circuit, and configured to determine whether the counting value is within a value range to output a second up signal and a second down signal;
    a selection circuit, coupled to the first comparing circuit and the second comparing circuit, and configured to output a second voltage signal according to the first up signal, the first down signal, the second up signal and the second down signal; and
    a voltage controlled oscillator, coupled to the phase detection circuit and the selection circuit, and configured to output the clock signal according to the first voltage signal and the second voltage signal.

2. The clock and data recovery circuit of claim 1, wherein the counting circuit comprises:
    a first divider, receiving the input signal, and dividing the input signal by a first number to generate the reset signal;
    a second divider, receiving the clock signal, and dividing the clock signal by a second number to generate the trigger signal, wherein the second number is less than the first number;
    a counter, coupled to the first divider and the second divider, and configured to update the counting value according to the trigger signal and the reset signal; and
    a register, coupled to the counter, and configured to store the counting value.

3. The clock and data recovery circuit of claim 2, wherein the second comparing circuit is configured to determine whether the counting value is greater than a first predetermined value, and determine whether the counting value is less than a second predetermined value, wherein the first predetermined value is greater than the second predetermined value;
    if the counting value is greater than the first predetermined value, the second comparing circuit enables the second down signal and disables the second up signal;
    if the counting value is less the first predetermined value and greater than the second predetermined value, the second comparing circuit disables the second down signal and the second up signal; and
    if the counting value is less than the second predetermined value, the second comparing circuit enables the second up signal and disables the second down signal.

4. The clock and data recovery circuit of claim 3, wherein the counting value has 5 bits, and the second comparing circuit comprises:
    a first AND gate, having two input terminals respectively receiving a fourth bit and a fifth bit of the counting value;
    a first OR gate, having three input terminals respectively receiving a first bit, a second bit and a third bit of the counting value;
    a second AND gate, having two input terminals respectively coupled to an output terminal of the first AND gate and an output terminal of the first OR gate, and an output terminal outputting the second down signal;
    a third AND gate, having two input terminals receiving the third bit and the fourth bit of the counting value;
    a second OR gate, having two input terminals receiving the first bit and the second bit of the counting value;
    a fourth AND gate, having two input terminals coupled to an output terminal of the third AND gate and an output terminal of the second OR gate;
    a third OR gate, having a first input terminal coupled to an output terminal of the fourth AND gate, and a second input terminal receiving the fifth bit of the counting value; and
    an inverter, having an input terminal coupled to an output terminal of the third OR gate, and an output terminal outputting the second up signal.

5. The clock and data recovery circuit of claim 1, wherein the first comparing circuit comprises:
    a first comparator, having an inverting input terminal coupled to a first predetermined voltage, a non-inverting input terminal receiving the first voltage signal, and an output terminal outputting the first up signal; and
    a second comparator, having an inverting input terminal coupled to the first voltage signal, a non-inverting input terminal coupled to a second predetermined voltage, and an output terminal outputting the first down signal, wherein the second predetermined voltage is lower than the first predetermined voltage.

6. The clock and data recovery circuit of claim 1, wherein the selection circuit comprises:
    a first P-type transistor, having a gate coupled to a first control voltage, and a source coupled to an operation voltage;
    a second P-type transistor, having a gate receiving the second up signal through a first inverter, and a source coupled to a drain of the first P-type transistor;
    a first N-type transistor, having a gate receiving the second down signal, and a drain coupled to a drain of the second P-type transistor;
    a second N-type transistor, having a gate coupled to a second control voltage, a drain coupled to a source of the first N-type transistor, and a source coupled to a ground voltage;

a third P-type transistor, having a source coupled to the operation voltage, and a gate coupled to the first control voltage;

a fourth P-type transistor, having a source coupled to a drain of the third P-type transistor, and a gate receiving the first up signal through a second inverter;

a third N-type transistor, having a drain coupled to a drain of the fourth P-type transistor, and a gate receiving the first down signal;

a fourth N-type transistor, having a drain coupled to a source of the third N-type transistor, a gate receiving the second control voltage, and a source coupled to the ground voltage; and a capacitor, having a first terminal coupled to the drain of the second P-type transistor and the drain of the fourth P-type transistor, and a second terminal coupled to the ground voltage, wherein the first terminal of the capacitor outputs the second voltage signal.

7. The clock and data recovery circuit of claim 6, wherein sizes of the first P-type transistor, the second P-type transistor, the first N-type transistor and the second N-type transistor are larger than sizes of the third P-type transistor, the fourth P-type transistor, the third N-type transistor and the fourth N-type transistor.

8. The clock and data recovery circuit of claim 1, wherein the voltage controlled oscillator comprises:
 a first bias voltage generator, generating a first bias voltage and a second bias voltage according to the first voltage signal;
 a second bias voltage generator, generating a third bias voltage and a fourth bias voltage according to the second voltage signal; and
 a ring oscillator, generating the clock signal according to the first bias voltage, the second bias voltage, the third bias voltage and the fourth bias voltage.

9. The clock and data recovery circuit of claim 8, wherein the first bias voltage generator comprises:
 a first P-type transistor, having a gate coupled to the first voltage signal;
 a second P-type transistor, having a source coupled to a source of the first P-type transistor;
 a first N-type transistor, having a gate coupled to the first voltage signal, a drain coupled to a gate of the second P-type transistor, and a source coupled to a ground voltage;
 a second N-type transistor, having a drain coupled to a drain of the first P-type transistor, a source coupled to the ground voltage, and a gate coupled to the drain of the second N-type transistor, wherein the gate of the second N-type transistor outputs the first bias voltage;
 a third N-type transistor, having a drain coupled to a drain of the second P-type transistor, a source coupled to the ground voltage, and a gate coupled to the drain of the third N-type transistor, wherein the gate of the third N-type transistor outputs the second bias voltage;
 a first current source, coupled between the source of the first P-type transistor and an operation voltage; and
 a first resistor, coupled between the operation voltage and the drain of the first N-type transistor.

10. The clock and data recovery circuit of claim 9, wherein the second bias voltage generator comprises:
 a third P-type transistor, having a gate coupled to the second voltage signal;
 a fourth P-type transistor, having a source coupled to a source of the third P-type transistor;
 a fourth N-type transistor, having a gate receiving to the second voltage signal, a drain coupled to a gate of the fourth P-type transistor, and a source coupled to the ground voltage;
 a fifth N-type transistor, having a drain coupled to a drain of the third P-type transistor, a source coupled to the ground voltage, and a gate coupled to the drain of the fifth N-type transistor, wherein the gate of the fifth N-type transistor outputs the third bias voltage;
 a sixth N-type transistor, having a drain coupled to a drain of the fourth P-type transistor, a source coupled to the ground voltage, and a gate coupled to the drain of the sixth N-type transistor, wherein the gate of the sixth N-type transistor outputs the fourth bias voltage;
 a second current source, coupled between the source of the third P-type transistor and the operation voltage; and
 a second resistor, coupled between the operation voltage and the drain of the fourth N-type transistor.

11. The clock and data recovery circuit of claim 10, wherein the ring oscillator comprises:
 M delay units, wherein each of the delay units has a differential input terminal and a differential output terminal;
 the differential output terminal of an $i^{th}$ delay unit of the M delay units is coupled to the differential input terminal of an $(i+1)^{th}$ delay unit of the M delay units;
 the differential output terminal of $M^{th}$ delay unit of the M delay units is coupled to the differential input terminal of a $1^{st}$ delay unit of the M delay units, and
 each of the M delay units outputs the clock signal through the differential output terminal according to the first bias voltage, the second bias voltage, the third bias voltage and the fourth bias voltage, wherein M is a positive integer greater than 1 and i is a positive integer less than M.

12. The clock and data recovery circuit of claim 11, wherein each of the delay units comprises:
 a seventh N-type transistor, having a gate coupled to a first terminal of the differential input terminal of the delay unit;
 an eighth N-type transistor, having gate coupled to a second terminal of the differential input terminal of the delay unit, and a source coupled to a source of the seventh N-type transistor;
 a ninth N-type transistor, having a gate coupled to a drain of the seventh N-type transistor, and a drain coupled to a first terminal of the differential output terminal of the delay unit;
 a tenth N-type transistor, having a gate coupled to the drain of the eighth N-type transistor, a drain coupled to a second terminal of the differential output terminal of the delay unit, and a source coupled to a source of the ninth N-type transistor;
 an eleventh N-type transistor, having a gate coupled to the first terminal of differential input terminal of the delay unit, and a drain coupled to the drain of the ninth N-type transistor;
 a twelfth N-type transistor, having a gate coupled to the second terminal of the differential input terminal of the delay unit, and a drain coupled to the drain of the tenth N-type transistor;
 a thirteenth N-type transistor, having a drain coupled to the source of the ninth N-type transistor, a source coupled to the ground voltage, and a gate coupled to the fourth bias voltage;

a fourteenth N-type transistor, having a drain coupled to the source of the tenth N-type transistor, a source coupled to the ground voltage, and a gate coupled to the second bias voltage;

a fifteenth N-type transistor, having a drain coupled to the source of the eleventh N-type transistor, a source coupled to the ground voltage, and a gate coupled to the third bias voltage;

a sixteenth N-type transistor, having a drain coupled to the source of the twelfth N-type transistor, a source coupled to the ground voltage, and a gate coupled to the first bias voltage;

a third resistor, coupled between a drain of the seventh N-type transistor and the operation voltage;

a fourth resistor, coupled between a drain of the eighth N-type transistor and the operation voltage;

a fifth resistor, coupled between the drain of the ninth N-type transistor and the operation voltage;

a sixth resistor, coupled between the drain of the tenth N-type transistor and the operation voltage;

a third current source, coupled between the source of the seventh N-type transistor and the ground voltage;

a first feedback resistor, coupled between the drain of the eighth N-type transistor and the drain of the ninth N-type transistor; and a second feedback resistor, coupled between the drain of the seventh N-type transistor and the drain of the tenth N-type transistor.

13. An electronic device comprising the clock and data recovery circuit of claim 1.

* * * * *